(12) United States Patent
Yang

(10) Patent No.: US 7,746,096 B1
(45) Date of Patent: Jun. 29, 2010

(54) IMPEDANCE BUFFER AND METHOD

(75) Inventor: Derek Yingqi Yang, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 590 days.

(21) Appl. No.: 11/138,823

(22) Filed: May 26, 2005

Related U.S. Application Data

(60) Provisional application No. 60/598,360, filed on Aug. 3, 2004.

(51) Int. Cl.
*H03K 17/16* (2006.01)
*H03K 19/003* (2006.01)
*H03K 19/0175* (2006.01)
*H03K 19/094* (2006.01)
*H03K 19/082* (2006.01)
*H03K 5/153* (2006.01)
*G06F 7/64* (2006.01)
*G06G 7/18* (2006.01)
*G06G 7/19* (2006.01)

(52) U.S. Cl. ............... 326/30; 326/34; 326/82; 326/83; 326/86; 326/87; 326/90; 326/91; 327/73; 327/77; 327/344; 327/513; 327/530; 327/538

(58) Field of Classification Search ............... 326/30
See application file for complete search history.

(56) References Cited

U.S. PATENT DOCUMENTS

| | | | | | |
|---|---|---|---|---|---|
| 6,064,244 | A | * | 5/2000 | Wakayama et al. | 327/158 |
| 6,166,563 | A | * | 12/2000 | Volk et al. | 326/87 |
| 6,307,424 | B1 | * | 10/2001 | Lee | 327/530 |
| 6,541,996 | B1 | * | 4/2003 | Rosefield et al. | 326/30 |
| 6,573,746 | B2 | * | 6/2003 | Kim et al. | 326/30 |
| 6,734,702 | B1 | * | 5/2004 | Ikeoku et al. | 326/30 |
| 6,815,979 | B2 | * | 11/2004 | Ooshita | 326/30 |
| 6,836,143 | B2 | * | 12/2004 | Song | 326/30 |
| 7,038,486 | B2 | * | 5/2006 | Aoyama et al. | 326/30 |

* cited by examiner

*Primary Examiner*—Rexford N Barnie
*Assistant Examiner*—Matthew C Tabler

(57) ABSTRACT

An impedance buffer has a single comparator with a first input and a second input. A first leg has a first pull-up array in series with a reference resistor. The first input of the single comparator is electrically coupled to a node between the first pull up array and the reference resistor. A second leg has a second pull-up array in series with a pull-down array. The second leg is coupled through a switch to the second input of the single comparator.

9 Claims, 3 Drawing Sheets

US 7,746,096 B1

IMPEDANCE BUFFER AND METHOD

RELATED APPLICATIONS

The present invention claims priority on provisional patent application, Ser. No. 60/598,360, filed on Aug. 3, 2004, entitled "Generic Programmable Impedance Architecture for High Speed Output Buffers".

FIELD OF THE INVENTION

The present invention relates generally to the field of electronic circuits and more particularly to an impedance buffer and method.

BACKGROUND OF THE INVENTION

Impedance mismatch between transmission lines and driver/receiver impedances can cause signal reflections and may degrade the signal. One solution to this problem has been a programmable impedance matching circuit on the transmitter and receiver. This input impedance matching circuit can be on-board or on-chip. On-board circuits take up a lot of board space. One embodiment of this invention utilizes an on-chip impedance matching circuit. A calibration resistor is used to define the pull-up and pull-down arrays impedances. The pull-up array is placed in series with the calibration impedance and a supply voltage is applied across the pull-up array and the calibration impedance. The voltage at the node between the pull-up array and the calibration impedance is compared to a reference voltage in a comparator. The impedance of the pull-up array is adjusted until the voltage at the node is equal to the reference voltage. Usually, the reference voltage is one half the supply voltage. As a result, the impedance of the pull-up array is equal to the calibration impedance. A second comparator is used to set the impedance of the pull-down array either by placing another pull-up array and pull-down array in series or another reference impedance in series with the pull-down array. Unfortunately, in these cases the offset of the comparators can add and result in two comparator offsets in the calibration impedance of the pull-down array. Also, it can introduce two comparator offsets between the impedance of the pull-up array and the pull-down array. In a single ended system, when data is transmitted between a transmitter and a receiver the data common mode depends on the value of the pull-up and pull-down impedance on the transmitter and the receiver. Also the data is sensed by comparing it with an ideal common mode [usually a reference voltage] in the receiver. Any mismatch between the data common mode and the ideal common mode causes clock-to-data skew. This skew may be significant in high speed signaling systems. The skew may occur because a negative going data pulse is clocked by a positive going clock pulse. One signal is controlled by pull-up array's impedance while the other signal is controlled by the pull-down array's impedance.

Thus there exists a need for an impedance buffer that improves accuracy and reduces the difference in the impedance between the pull-up array and the pull-down array.

SUMMARY OF INVENTION

An impedance buffer that overcomes these and other problems has a single comparator with a first input and a second input. A first leg has a first pull-up array in series with a reference resistor. The first input of the single comparator is electrically coupled to a node between the first pull up array and the reference resistor. A second leg has a second pull-up array in series with a pull-down array. The second leg is coupled through a switch to the second input of the single comparator. A reference voltage may be coupled through a second switch to the second input of the single comparator. A pull-up counter/register may be coupled through a third switch to an output of the single comparator. A pull-down counter/register may be coupled through a fourth switch to an output of the single comparator. The pull-up counter/register may have an output coupled to the first pull-up array. The pull-up counter/register may have an output coupled to the second pull-up array. The pull-down counter/register may have an output coupled to the pull-down array.

In one embodiment, a method of operating an impedance buffer includes the steps of comparing a first voltage at a first node between a first pull-up array and a reference resistor to a reference voltage to form a first difference output. An impedance of the first pull-up array is adjusted based on the first difference output. A second voltage at a second node between a second pull-up array and a pull-down array is compared to the first voltage at the first node to form a second difference output. An impedance of the pull-down array may be adjusted based on the second difference output. The first pull-up array and the reference resistor may be placed in series between a supply voltage and a ground. A first switch may be closed between the reference voltage and an input of a comparator. A second switch may be between the input of the comparator and the second node. A third switch may be closed between an output of the comparator and a pull-up counter/register. The pull-up counter/register may be incremented or decremented based on the first difference output on the output of the comparator. A fourth switch may be open between the output of the comparator and a pull-down counter/register. The comparing and adjusting steps may be repeated until the first difference output is near zero volts. When the first difference output is near zero volts the process proceeds to the comparing and adjusting of pull-down array. An impedance of the second pull-up array is adjusted to be equal to the impedance of the first pull-up arrays. The second pull-up array and the pull-down array is placed in series between a supply voltage and a ground. A second switch is closed between the second node and an input of a comparator. A first switch is opened between a reference voltage and the input of the comparator.

In one embodiment, an impedance buffer has a single comparator with a first input, a second input and an output. A first leg has a first node electrically coupled to the first input of the single comparator. A second leg has a second node electrically coupled to the second input of the single comparator. A reference voltage may be electrically coupled to the second input of the single comparator. A first switch may be placed between the reference voltage and the second input of the single comparator. A second switch may be between the second node and the second input of the single comparator.

DETAILED DESCRIPTION OF THE DRAWINGS

Figure 1:
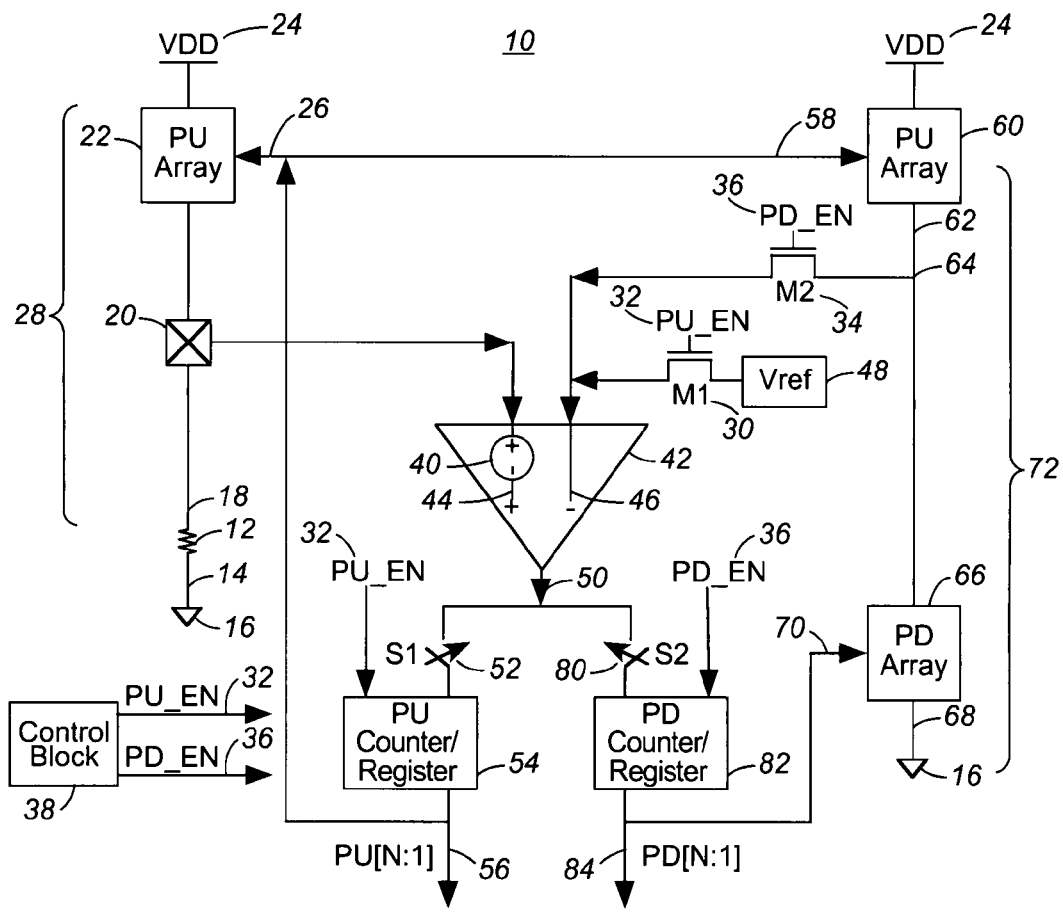
FIG. 1 is a block diagram of an impedance buffer in accordance with one embodiment of the invention.

The impedance buffer described herein reduces the impedance mismatch between the pull-up array and the pull-down array and improves accuracy. FIG. 1 is a block diagram of an impedance buffer 10 in accordance with one embodiment of the invention. The buffer 10 has a reference or calibration impedance 12 that may be a resistor. This resistor 12 has a first terminal 14 coupled to a ground 16 and a second terminal 18 electrically coupled to a pad 20 or first node. The first node 20 is coupled to a pull-up (PU) array 22 and the pull-up array 22 is coupled to a power supply voltage (VDD) 24. The pull-up array 22 has a control input 26. The pull-up array 22 and reference impedance 12 form a first leg of the impedance buffer.

The first node 20 is coupled to a comparator represented schematically as an offset voltage source 40 and an ideal comparator 42. As a result, the first node 20 is connected to the positive input 44 of the comparator 42. The negative input 46 of the comparator 42 is coupled to a reference voltage (Vref) 48 through a first switch (M1) 30. The first switch 30 is controlled by a pull-up enable (PU_EN) signal 32. The negative input 46 of the comparator is coupled to a second node (Dout) 64 through a second switch (M2) 34. The second switch 34 is controlled by a pull-down enable signal (PD_EN) 36. The control signals 32 & 36 are generated by a control block 38.

The output 50 of the comparator 42 is coupled through a switch (S1) 52 to a pull-up counter/register 54. The counter/register 54 has a control input 32 and a pull-up output 56. The output 56 is coupled to the control input 26 of the pull-up array 22 and the control input 58 of a second pull-up array 60.

The second pull-up array 60 has a first terminal coupled to the supply voltage 24 and a second terminal 62 coupled through second node 64 to a pull-down (PD) array 66. The pull-down array 66 has a second terminal 68 coupled to ground 16. The pull-down array 66 has a control input 70.

The output 50 of the comparator 42 is coupled through a second switch (S2) 80 to a pull-down counter/register 82. The output 84 of the pull-down counter/register 82 is coupled to the control input 70 of the pull-down array 66. The second pull-up array 60 and the pull-down array 66 form a second leg 72 of the impedance buffer 10.

Initially, the first leg 28 is enabled while the second leg 72 is disabled. This means that switch (M1) 30 is closed, switch one 52 is closed, while switch (M2) 34 is open and switch two 80 is open. The output 50 of the comparator 42 is coupled to the pull-up counter/register 54. Every time the comparator 42 finds a difference in the voltage on its positive input 44 and its negative input 46, the pull-up counter/register 54 is incremented or decremented. This turns off or on fingers in the pull-up array 22 which changes the impedance of the pull-up array 22. The pull-up array 22 is described in more detail with respect to FIG. 3. This process continues until the impedance of the pull-up array 22 equals the impedance of the calibration impedance 12 or the output 50 is essentially zero volts. The corresponding n-bit word is stored in the pull-up register 54.

Once the pull-up array bits are stored in the pull-up register 54, the pull-down loop is activated. This means that switch (M2) 34 is closed, switch two 80 is closed, while switch (M1) 30 is open and switch one 52 is open. The output 50 of the comparator 42 is coupled to the pull-down counter/register 82. Every time the comparator 42 finds a difference in the voltage on its positive input 44 and its negative input 46, the pull-down counter/register 82 is incremented or decremented. This turns on or off fingers in the pull-down array 66 which changes the impedance of the pull-down array 66. The pull-down array 66 is described in more detail with respect to FIG. 4. This process continues until the impedance of the pull-down array 66 equals the impedance of the second pull-up array 60. The corresponding n-bit word is stored in the pull-down register 82. Note that in one embodiment the reference voltage 48 is one half the supply voltage.

This information of how to set the pull-up array and pull-down array may now be used in with an output driver or an input buffer. Since a single comparator 42 is used in the buffer 10, the pull-up array and the reference impedance in the first leg may differ only by a single comparator offset voltage rather than being off by as much as two comparator offset voltages. This reduces timing skew and other problems associated with impedance mismatches.

Figure 2:
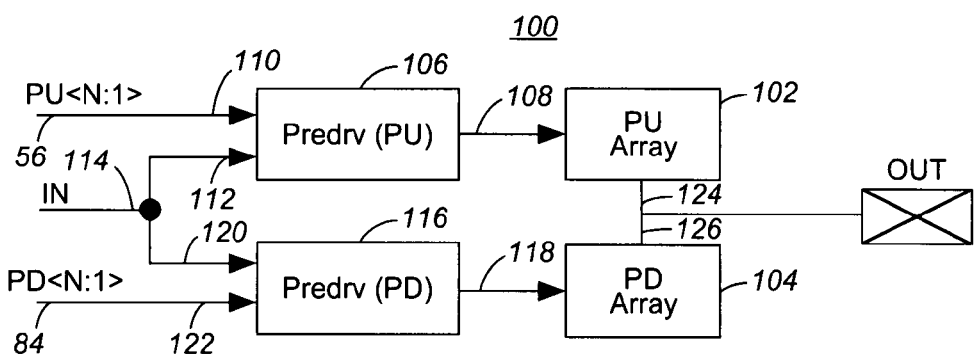
FIG. 2 is a block diagram of an output driver in accordance with one embodiment of the invention.

FIG. 2 is a block diagram of an output driver 100 in accordance with one embodiment of the invention. The driver circuit 100 has a pull-up array 102 and a pull-down array 104, which are replicas of the pull-up array 22 and the pull-down array 66 shown in FIG. 1. The circuit 100 has a pull-up predriver 106 with an output 108 coupled to the pull-up array 102. One input 110 to the pull-up predriver 106 is the n-bit word from the pull-up register 54 output 56. The other input 112 is the input signal 114. A pull-down predriver 116 has an output 118 coupled to the pull-down array 104. One input 122 to the pull-down predriver 116 is the n-bit word from the pull-down register 82 output 84. The other input 120 is the input signal 114. The output 124 of the pull-up array 102 is combined with the output 126 of the pull-down array 104.

Figure 3:
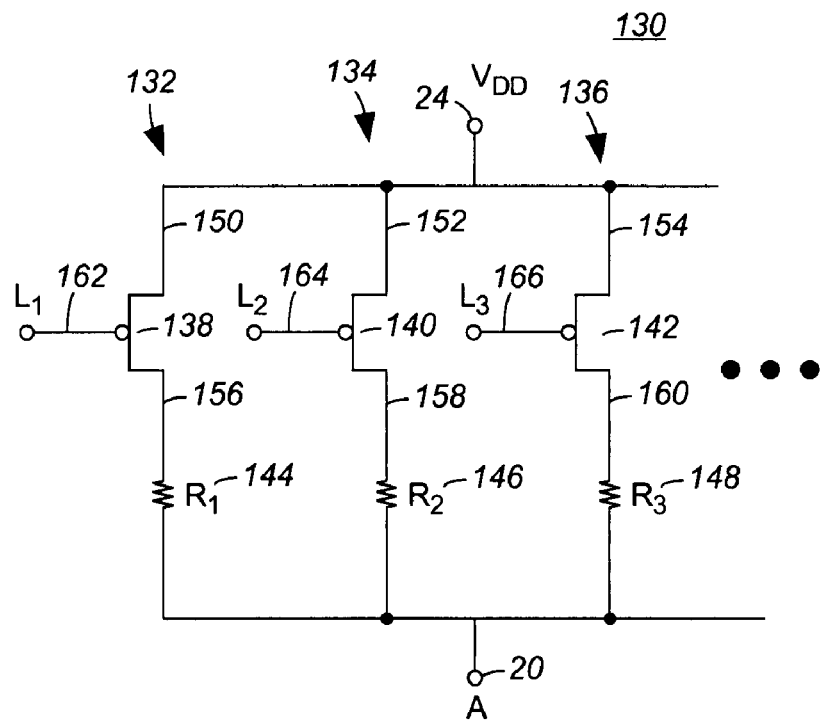
FIG. 3 is a circuit diagram of a pull-up array in accordance with one embodiment of the invention.

FIG. 3 is a circuit diagram of a pull-up array 130 in accordance with one embodiment of the invention. The pull-up array has a number of fingers 132, 134, 136 of which only three are shown. Each finger consists of a p-type transistor 138, 140, 142 in series with a resistor or impedance 144, 146, 148. The sources 150, 152, 154 are connected to the power supply voltage (VDD) 24. The drains 156, 158, 160 are coupled to the resistors 144, 146, 148 respectively. The other terminal of the resistors 144, 146, 148 is coupled to node A 20 (In FIG. 1 left side). Each of the legs 132, 134, 136 are activated by the pull-up register 54 placing a low voltage on the gates (L1, L2, L3) 162, 164, 166. As a result, if the signal L1 162 is low, transistor 138 is on and current flows through resistor 144. In this way the impedance of the pull-up array 130 is varied.

Figure 4:
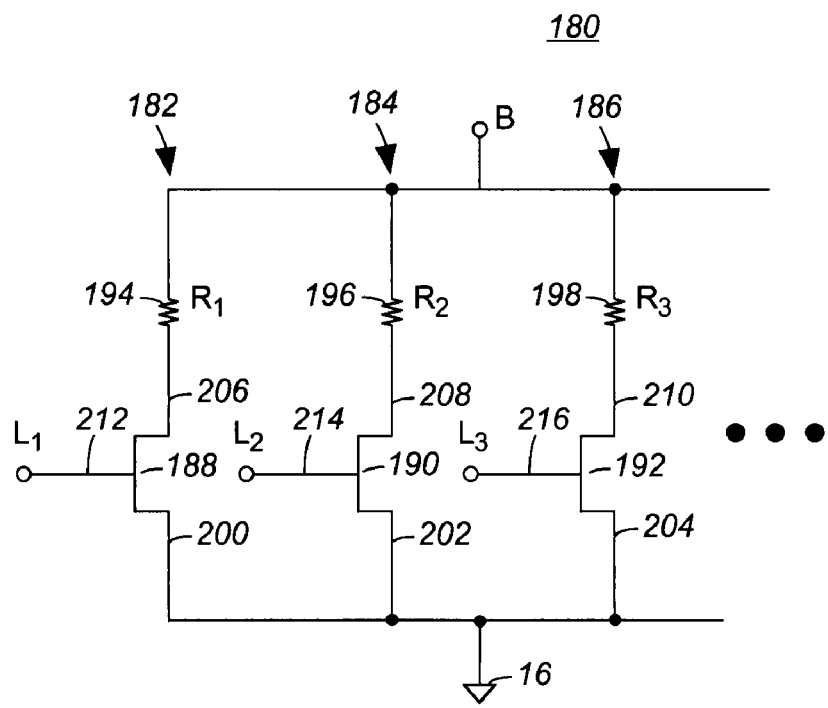
FIG. 4 is a circuit diagram of a pull-down array in accordance with one embodiment of the invention.

FIG. 4 is a circuit diagram of a pull-down array 180 in accordance with one embodiment of the invention. The pull-down array has a number of fingers 182, 184, 186 of which only three are shown. Each finger consists of an n-type transistor 188, 190, 192 in series with a resistor or impedance 194, 196, 198. The sources 200, 202, 204 are connected to the ground 16. The drains 206, 208, 210 are coupled to the resistors 194, 196, 198 respectively. The other terminal of the resistors 194, 196, 198 is coupled to node B 64 (In FIG. 1 right side). Each of the legs 182, 184, 186 are activated by the pull-down register 82 placing a high voltage on the gates (L1, L2, L3) 212, 214, 216. As a result, if the signal L1 212 is high, transistor 188 is on and current flows through resistor 194. In this way the impedance of the pull-down array 180 is varied.

Figure 5:
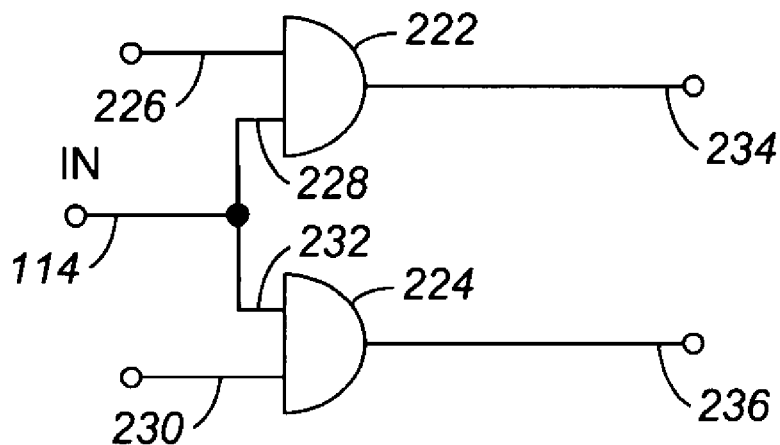
FIG. 5 is a circuit diagram of a pull-down predriver in accordance with one embodiment of the invention.

FIG. 5 is a circuit diagram of a pull-down predriver 220 in accordance with one embodiment of the invention. The pull-down predriver 220 is part of the output driver circuit 100 of FIG. 2. The predriver 220 has a number of AND gates 222, 224 of which only two are shown. AND gate 222 has a first input 226 coupled to the bit 1 or leg one output of the pull-down register 84. The other input 228 is coupled to the input signal 114. AND gate 224 has a first input 230 coupled to the bit 2 or leg two output of the pull-down register 84. The other input 232 is coupled to the input signal 114. The output 234 of AND gate 222 forms the input to a first leg of the pull-down array 104 of the driver circuit 100. The output 236 of AND gate 224 forms the input to a second leg of the pull-down array 104 of the driver circuit 100.

Figure 6:
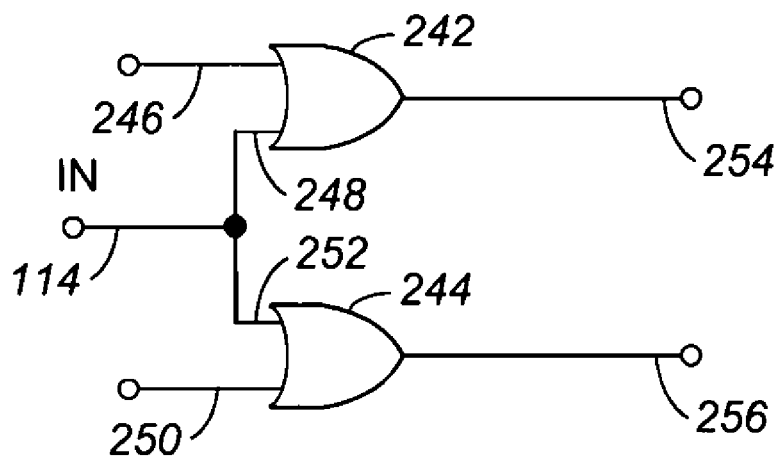
FIG. 6 is a circuit diagram of a pull-up predriver in accordance with one embodiment of the invention.

FIG. 6 is a circuit diagram of a pull-up predriver 240 in accordance with one embodiment of the invention. The pull-up predriver 240 is part of the output driver circuit 100 of FIG. 2. The predriver 240 has a number of OR gates 242, 244 of which only two are shown. OR gate 242 has a first input 246 coupled to the bit 1 or leg one output of the pull-up register 54. The other input 248 is coupled to the input signal 114. OR gate 244 has a first input 250 coupled to the bit 2 or leg two output of the pull-up register 54. The other input 252 is coupled to the input signal 114. The output 254 of OR gate 242 forms the input to a first leg of the pull-up array 102 of the driver circuit 100. The output 256 of OR gate 244 forms the input to a second leg of the pull-up array 102 of the driver circuit 100.

Thus there has been described an impedance buffer that decreases the error between the pull-up array and the pull-down array. This reduces any impedance mismatches which may result in timing skews between the data and the clock.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A method of operating an impedance buffer comprising:
   a) comparing a first voltage at a first node between a first pull-up array and a reference resistor to a reference voltage to form a first difference output using a comparator;
   b) adjusting an impedance of the first pull-up array based on the first difference output; and
   c) comparing a second voltage at a second node between a second pull-up array and a pull-down array to the first voltage at the first node to form a second difference output using the comparator.

2. The method of claim 1, further comprising:
   d) adjusting an impedance of the pull-down array based on the second difference output.

3. The method of claim 1, wherein (a) further comprises:
   a1) placing the first pull-up array and the reference resistor in series between a supply voltage and a ground.

4. The method of claim 1, wherein (a) further comprises:
   a1) closing a first switch between the reference voltage and an input of the comparator;
   a2) opening a second switch between the input of the comparator and the second node.

5. The method of claim 4, wherein (a) further comprises:
   a3) closing a third switch between an output of the comparator and a pull-up counter/register, wherein the output of the comparator comprises a first difference output;
   a4) incrementing or decrementing the pull-up counter/register based on the first difference output of the comparator.

6. The method of claim 5, wherein (a3) further comprises:
   i) opening a fourth switch between the output of the comparator and a pull-down counter/register.

7. The method of claim 1, wherein (b) further comprises:
   b1) repeating the comparing and adjusting steps-until the first difference output is near zero volts;
   b2) when the first difference output is near zero volts moving to (c).

8. The method of claim 1, wherein (c), further comprises:
   c1) adjusting an impedance of the second pull-up array to be equal to the impedance of the first pull-up array.

9. The method of claim 8, further comprising:
   c2) placing the second pull-up array and the pull-down array in series between a supply voltage and a ground;
   c3) closing a second switch between the second node and an input of a comparator; and
   c4) opening a first switch between a reference voltage and the input of the comparator.

* * * * *